(12) United States Patent
Vogelsang

(10) Patent No.: US 11,894,093 B2
(45) Date of Patent: *Feb. 6, 2024

(54) STACKED DRAM DEVICE AND METHOD OF MANUFACTURE

(71) Applicant: Rambus Inc., San Jose, CA (US)

(72) Inventor: Thomas Vogelsang, Mountain View, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/568,649

(22) Filed: Jan. 4, 2022

(65) Prior Publication Data

US 2022/0238141 A1 Jul. 28, 2022

Related U.S. Application Data

(63) Continuation of application No. 17/135,138, filed on Dec. 28, 2020, now Pat. No. 11,227,639, which is a
(Continued)

(51) Int. Cl.
| | |
|---|---|
| *G11C 5/06* | (2006.01) |
| *H01L 23/48* | (2006.01) |
| *H01L 25/065* | (2023.01) |
| *H10B 12/00* | (2023.01) |
| *G11C 5/02* | (2006.01) |

(52) U.S. Cl.
CPC .............. *G11C 5/063* (2013.01); *G11C 5/025* (2013.01); *H01L 23/481* (2013.01);
(Continued)

(58) Field of Classification Search
CPC .... G11C 5/063; G11C 5/025; H01L 27/10897
See application file for complete search history.

(56) References Cited

U.S. PATENT DOCUMENTS 7,701,252 B1 * 4/2010 Chow ................ H01L 25/0657
326/47
7,930,661 B1 4/2011 Trimberger et al.
(Continued)

OTHER PUBLICATIONS

Kang, Uksong et al., "8Gb 3D DDR3 DRAM Using Through-Silicon-via Technology," IEEE International Solid-State Circuits Conference—Digest of Technical Papers, 2009. ISSCC 2009. pp.130,131,131a & pp. 1-21 of Supplement. Feb. 8-12, 2009. 24 pages.

(Continued)

*Primary Examiner* — Mohammed A Bashar
(74) *Attorney, Agent, or Firm* — Lance Kreisman; Peninsula Patent Group

(57) ABSTRACT

A memory device includes a first dynamic random access memory (DRAM) integrated circuit (IC) chip including first memory core circuitry, and first input/output (I/O) circuitry. A second DRAM IC chip is stacked vertically with the first DRAM IC chip. The second DRAM IC chip includes second memory core circuitry, and second I/O circuitry. Solely one of the first DRAM IC chip or the second DRAM IC chip includes a conductive path that electrically couples at least one of the first memory core circuitry or the second memory core circuitry to solely one of the first I/O circuitry or the second I/O circuitry, respectively.

20 Claims, 10 Drawing Sheets

Related U.S. Application Data continuation of application No. 16/801,990, filed on Feb. 26, 2020, now Pat. No. 10,885,946, which is a continuation of application No. 16/256,887, filed on Jan. 24, 2019, now Pat. No. 10,614,859, which is a continuation of application No. 15/603,333, filed on May 23, 2017, now Pat. No. 10,204,662, which is a continuation of application No. 14/114,725, filed as application No. PCT/US2012/037664 on May 11, 2012, now Pat. No. 9,666,238.

(60) Provisional application No. 61/485,359, filed on May 12, 2011.

(52) U.S. Cl.
CPC ......... *H01L 25/0657* (2013.01); *H10B 12/50* (2023.02); *H01L 2225/06513* (2013.01); *H01L 2225/06541* (2013.01); *H01L 2225/06596* (2013.01); *H01L 2924/0002* (2013.01)

(56) References Cited

U.S. PATENT DOCUMENTS

| | | | |
|---|---|---|---|
| 9,171,824 B2 | 10/2015 | Best | |
| 2004/0257847 A1* | 12/2004 | Matsui | G11C 5/04 365/63 |
| 2006/0126369 A1 | 6/2006 | Raghuram | |
| 2007/0279176 A1 | 12/2007 | Chen et al. | |
| 2009/0040861 A1 | 2/2009 | Ruckerbauer | |
| 2009/0161401 A1 | 6/2009 | Bilger et al. | |
| 2009/0319703 A1 | 12/2009 | Chung | |
| 2009/0321893 A1 | 12/2009 | Somasekhar et al. | |
| 2010/0020583 A1* | 1/2010 | Kang | G11C 29/14 365/51 |
| 2010/0195364 A1 | 8/2010 | Riho | |
| 2011/0309475 A1 | 12/2011 | Lee | |
| 2013/0329478 A1 | 12/2013 | Yu et al. | |

OTHER PUBLICATIONS

Notification of Transmittal of the International Search Report and Written Opinion of the Int'l Searching Authority for PCT/US2012/037664 dated Oct. 11, 2012. 11 pages.

PCT Communication in cases for which no other form is applicable for PCT/US2012/037664 dated Nov. 9, 2012. 3 pages.

PCT International Preliminary Report on Patentability dated Nov. 21, 2013 (Chapter I) in International Application No. PCT/US2012/037664. 8 pages.

Response to Communication, dated Jun. 25, 2012, In International Application No. PCT/US2012/037664, Includes Replacement Sheet and Declaration. 3 pages.

\* cited by examiner

STACKED DRAM DEVICE AND METHOD OF MANUFACTURE

CROSS-REFERENCE TO RELATED APPLICATIONS

This application is a Continuation of U.S. Ser. No. 17/135,138, filed Dec. 28, 2020, entitled "STACKED DRAM DEVICE AND METHOD OF MANUFACTURE" which is a Continuation of U.S. Ser. No. 16/801,990, filed Feb. 26, 2020, entitled "STACKED DRAM DEVICE AND METHOD OF MANUFACTURE", now U.S. Pat. No. 10,885,946, which is a Continuation of U.S. Ser. No. 16/256,887, filed Jan. 24, 2019, entitled "STACKED DRAM DEVICE AND METHOD OF MANUFACTURE", now U.S. Pat. No. 10,614,859, which is a Continuation of U.S. Ser. No. 15/603,333, filed May 23, 2017, entitled "STACKED DRAM DEVICE AND METHOD OF MANUFACTURE", now U.S. Pat. No. 10,204,662, which is a Continuation of U.S. Ser. No. 14/114,725, filed Oct. 29, 2013, entitled "STACKED DRAM DEVICE AND METHOD OF MANUFACTURE", now U.S. Pat. No. 9,666,238, which claims priority from International Application No. PCT/US2012/037664 published as US 2014/0063887 A1 on Mar. 6, 2014, which claims priority from U.S. Provisional Application No. 61/485,359, filed May 12, 2011, entitled "STACKED DRAM DEVICE AND METHOD OF MANUFACTURE." Application Ser. Nos. 15/603,333, 14/114,725, International Application No. PCT/US2012/0063887 and U.S. Provisional Application No. 61/485,359 are hereby incorporated by reference in their entirety.

TECHNICAL FIELD

The disclosure herein relates to semiconductors, and more particularly to semiconductor packages employing multiple integrated circuit chips.

BACKGROUND

Many computer systems use dynamic random access memory (DRAM) as system memory to temporarily store an operating system, critical applications, and data. With widespread use of multi-core processors, particularly, in servers and workstations, higher capacity and faster memory devices are needed to catch up with the computing power of these processors, thereby reducing the processor-memory performance gap and allowing the applications to use the full processing speed of modern processors.

One way to narrow the processor-memory performance gap is to develop innovative technologies to enhance characteristics of DRAM chips in terms of capacity and bandwidth. Yet another way is to increase storage capacity by stacking memory chips, while using existing DRAM technologies. For example, in servers and storage applications, depth stacking can be used to obtain high memory densities in a smaller space and most likely at a lower cost. Other industrial or embedded applications may demand different memory requirements, but typically high-density depth stacking is needed where space is constrained, therefore requiring more memory capacity on the same or a smaller memory module form factor.

Stacked memory dies can be formed by mounting two or more memory dies, one on top of the other, and interconnecting them using through-silicon-vias (TSVs). Conventional solutions use substantially identical memory dies derived from the same mask set to form memory stacks. While these solutions allegedly work for their intended applications, there are a number of disadvantages associated with these solutions. For example, by using substantially identical dies in the stack, certain cost saving opportunities may be lost. For instance, there are some features that may only be needed on one of the memory dies of the stack. Such features may not have to be fabricated in the other memory dies of the stack. On the other hand, if some of these features are omitted on all of the dies, the substantially identical memory dies used in conventional memory stacks may not be viable for use as stand-alone memory devices in a cost effective manner.

Thus, the need exists for a high density memory device formed by stacking memory dies which are not substantially identical, therefore alleviating the disadvantages of the conventional solutions. Embodiments described herein satisfy this need.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of stacked memory devices each including a number of memory dies are disclosed herein. One embodiment of a stacked memory device comprises a master memory die and a slave memory die. The slave memory die includes a memory interface circuit and a memory core formed by a number of memory cell arrays. The slave memory die further includes first and second low-resistance metal layers that form first and second distribution lines in the memory core, respectively. The memory interface circuit in the slave memory die is decoupled from the first and second low-resistance metal layers. The slave memory die communicates with the master memory die using one or more through-silicon-vias (TSVs).

In a further embodiment, a memory device is described as comprising a master memory die and a slave memory die coupled to the master memory die in a stacked configuration. Each of the master and slave dies includes memory core circuitry having memory cell arrays. The memory dies also include first and second low-resistance metal layers that respectively form first and second distribution lines in the memory core and interface circuitry. The master memory die is further formed with one or more additional metal layers and the core circuitry of the slave memory die couples to the interface circuitry of the master die via the one or more third metal layers.

In a further embodiment, a memory module is disclosed as comprising a substrate and a number of memory devices mounted to the substrate. Each of the memory devices comprises a master memory die and a slave memory die coupled to the master memory die in a stacked configuration. Each of the master and slave memory dies includes memory core circuitry, first and second low-resistance metal layers, and an interface circuitry. The memory core circuitry comprises a number of memory cell arrays. The first and second low-resistance metal layers form first and second distribution lines in the memory core, respectively. The master memory die is further formed with one or more third metal layers and the memory core circuitry of the slave memory die couples to the interface circuitry of the master memory die via one or more of the third metal layers.

In yet another embodiment, a method of fabricating a memory die is disclosed as comprising forming core circuitry and interface circuitry on a semiconductor substrate. The method further includes forming first and second low-resistance metal layers including first and second distribution lines in a memory core circuitry area on the semiconductor substrate. Next, a passivation layer is formed on the second low-resistance metal layer. The first and second low-resistance metal layers are decoupled from the interface circuitry.

Figure 1:
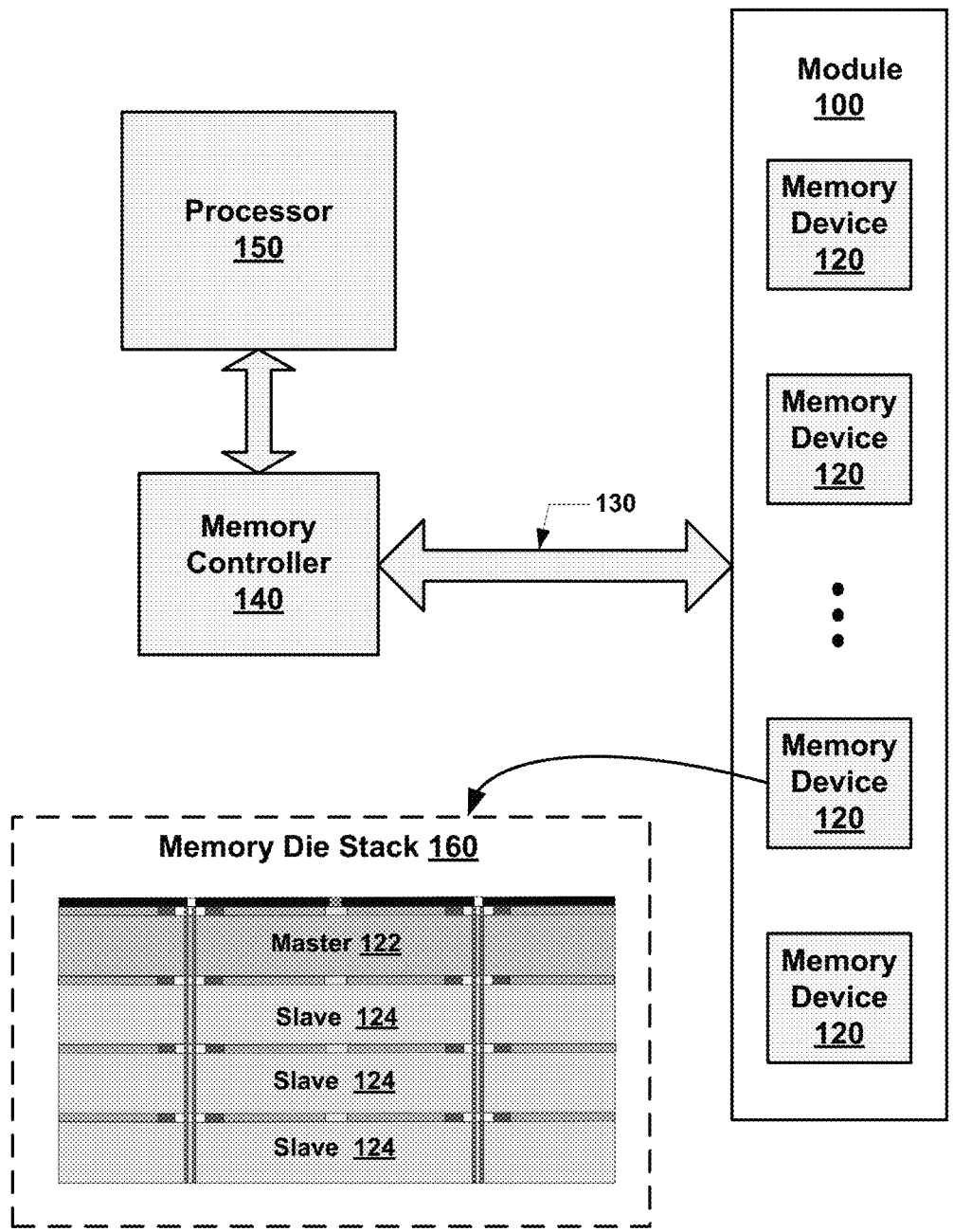
FIG. 1 illustrates a memory system using a dual in-line memory module (DIMM) including memory die stacks formed by stacking master and slave memory dies according to an embodiment.

FIG. 1 illustrates a memory system using DIMM 100 including memory die stack 160 formed by stacking master and slave memory dies 122 and 124 according to an embodiment. The DIMM 100 includes a number of memory devices, such as DRAM devices, mounted on one side of a substrate forming a single-rank DIMM. Alternatively, the memory devices may be mounted on both sides of the substrate forming a dual-rank DIMM. The memory module 100 communicates to a memory controller 140 via a memory bus 130. The memory controller 140 communicates with an interface circuit associated with each memory device 120. The memory controller 140 includes logic circuitry that controls read, write, and refresh operations of each memory device 120. The read and write operations may be performed in response to requests received from a processor 150. The memory bus 130 includes a data bus and an address/command bus, each comprising a multitude of data and address/command lines, respectively. The address portion of the address/command bus comprises a number of address line carrying signals that identify the location of data in the memory module 100. The command portion of the address/command bus conveys instructions such as read, write, and refresh commands issued by the memory controller 140.

Each of the memory devices 120 comprises at least one memory chip, such as a DRAM chip. Each DRAM chip may provide 4 bits (×4), 8 bits (×8), or 16 bits (×16) of a 64-bit data word. For example, it takes eight ×8 DRAM chips or sixteen ×4 chips to provide a 64-bit word. Many single-rank DIMMs may have enough room to hold nine memory chips on one side of the DIMM, where the ninth chip is used for storing error correction code (EEC). In some applications, such as servers, several high density modules (e.g., 32-Gb modules) may be used. A 32-Gb module, for example, may include eight high density memory chips, such as memory devices 120, each providing 4 Gb of storage capacity. A 4-Gb memory device may be manufactured, for instance, by forming a memory die stack comprising a number of memory dies. For example, the memory device 120 may comprise a memory die stack 160 including a master memory die 122 (herein after "master die 122") and one or more, such as three, slave memory dies 124 (hereinafter "slave die 124"). The master die 122, as shown in FIG. 1, sits on the top of the memory die stack 160. However, after packaging, the memory die stack is coupled to a packaging substrate that holds integrated circuit (IC) terminals via which the memory device communicates with other devices, such that the master die 122 would be at the bottom of the stack and bonded to the packaging substrate by using, for example, a flip-chip bonding technique.

Each of the master and slave dies 122 and 124 may include a memory core, first and second low-resistance metal layers, and an interface for communication with the memory controller 140. In the slave die 124, the interface is not coupled to the first and second low-resistance metal layers via any conductors on the slave die. The master and slave dies 122 and 124 are interconnected by using multiple TSVs. The interface circuit of the master die 122 is coupled to its memory core via conductors on the master die. The interface circuit of the master die 122 is coupled to the first and second low-resistance metal layers of each of slave dies 124 through one or more TSVs, as will be described in more detail below.

Figure 2:
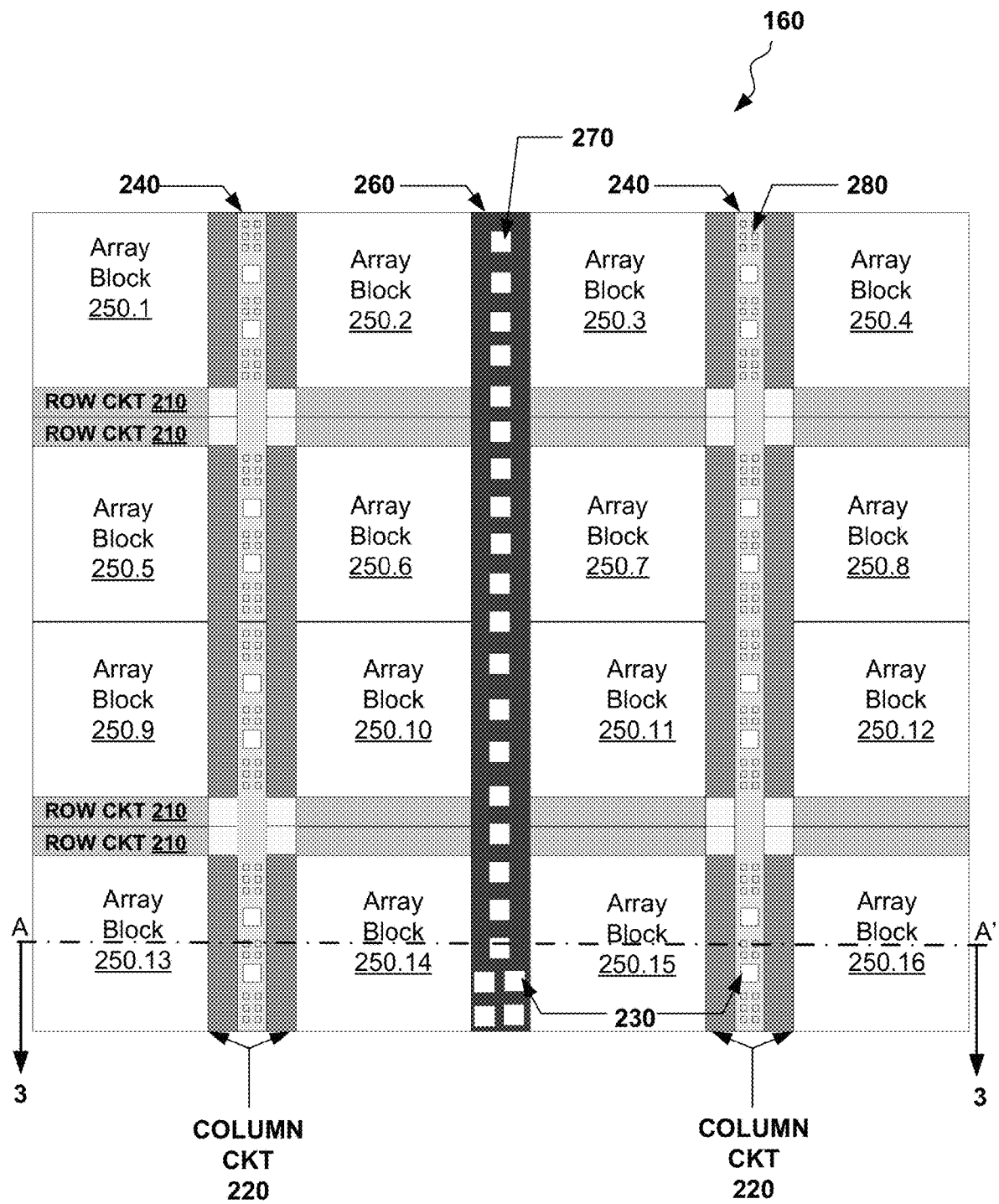
FIG. 2 illustrates a top view of a memory die stack of FIG. 1 according to an embodiment.

FIG. 2 illustrates a top view of a memory die stack 160 of FIG. 1 according to an embodiment. The top view depicts the structure of the master die 122, which is shown in FIG. 1 as the top die of the memory die stack 160. The structures shown in the top view, except for connection pads 270, which are only formed in the master die 122, are common between master and slave dies 122 and 124. Hence, when describing these common structures, reference is made to a "memory die" instead of the master die 122 or the slave die 124.

The memory die comprises a memory core including a number of memory array blocks 250 (e.g., 16 array blocks 250.1-250.16), several support structures including one or more TSV support stripes 240 (hereinafter "TSV stripe 240"), one or more interface support stripes 260 (hereinafter "interface 260"), multiple (e.g., four) column circuit 220, multiple (e.g., four) row circuits 210, and a multitude of TSVs 280. The number of TSVs depends on the desired bandwidth of the data connection, the granularity of the addressing and commands and the operation frequency of the signaling on the TSVs. Typical numbers are between a few hundred and a few thousand.

The memory core may include a large number of array memory cells (e.g., four billion cells in a 4-Gb chip) arranged in a number of (e.g., 16) memory array blocks 250 (hereinafter "array blocks 250"). Each array block 250 may include a multitude of (e.g., 1024) memory sub-arrays, each arranged in multiple (e.g., 512) columns and multiple (e.g., 512) rows. Each array block 250 is arranged such that it is adjacent to a portion of a row circuit 210 and a portion of a column circuit 220. The array blocks 250, in addition to array cells, contain other circuitries known as on-pitch circuitries (their numbers correspond to bit-lines or word-lines pitches) including bit-line sense amplifiers (i.e. primary sense amplifiers) and word-line drivers and decoders.

Each row circuit 210 comprises a number of circuits including, but not limited to, word-line driver circuits, row-address decoders, and word-line redundancy circuits. Each column circuit 220 comprises multiple circuits including, but not limited to, column-line driver circuits, column-address decoders, column-line redundancy circuits, and secondary sense amplifiers, which are connected to array data lines and further amplify signals after the primary sense amplifiers.

The interface 260 is formed near the connection pads 270 and comprises interface circuitry, which among other functions, buffers the signals communicated between TSVs 280 and the bond pads. The interface 260 comprises a number of circuits including, but not limited to, any of input/output (I/O) drivers, I/O receivers, re-drivers, decoders, ESD circuits, multiplexing and data steering circuits. It is important to note that as a distinct feature of the disclosed embodiments, the interface 260, in the slave die 124 is not coupled to the memory core (i.e., array blocks 250). However, as will be explained in more detail with respect to FIGS. 3 and 4, in the master die 122, the interface 260 is coupled to the array blocks 250 via one or more third metal layers.

With continued reference to FIG. 2, TSV stripes 240 are formed as one or more (e.g., two) stripes, each encompassing a number of TSVs 280. In a preferred embodiment, there are two TSV stripes 240 formed symmetrically at approximately equal distances from the interface 260. Depending on the application, however, the number of TSV stripes may depend on a bit width of the memory die stack 160. Each TSV stripe 240 comprises circuitries that are coupled to and communicate with the array blocks 250. These circuitries include, but are not limited to, circuits that generate array block control signals, circuits that send and receive data from array blocks 250, circuits that generate power for array blocks 250, and circuits that drive/receive TSV signals.

The connection pads 270 connect various circuits formed on the memory device 120 to circuits external to the device. The connection pads 270 include I/O pads, power supply pads, ground pads, and the like, which are coupled to the circuits in the interface 260 and through the interface 260 and distribution lines formed by the third metal layers (not shown in FIG. 2) to the memory core (i.e., array blocks 250). The I/O pads may be coupled to the memory controller 140 via terminals of the memory module 100.

The connection pads 270 may be of any suitable shape, such as square, round, or the like. In some embodiments, each group of connection pads 270 is a stripe of connection pads that extends substantially across a respective side of the memory device 120, i.e., each stripe may form a column (or row, depending on orientation) across a side of the memory device. In some embodiments, each group of connection pads 270 is located near the middle of memory device 120 over the interface 260, however, in other embodiments, the connection pads 270 may be located near an edge or anywhere else on the master die 122 of the memory die stack 160. The connection pads 270 are only formed using the third metal layers on the master die 122, which are coupled to corresponding terminals of the memory device 120 through interconnections formed in the substrate.

Further referring to FIG. 2, the test pads 230 are used to test array blocks 250 and functionalities of various circuitries of the memory device 120. The test pads 230 are coupled by vias to first and second low-resistance metal layers, through which they can access groups of lines connected to various memory device circuitries, for example, master word-lines, sense amplifier control signal lines, array data-lines, column select lines, and signal and power distribution lines. The test pads 230 are formed both on the master die 122 and the slave dies 124. The test pads 230 are formed so that they can be contacted by a test probe on their top metal layer. This top metal layer is the second metal layer on the slave dies 124 and either the second or third metal layer on the master die 122. After the stack has been assembled, only the test pads 230 on the master die can be accessed. The test pads 230 may be of any suitable shape, such as square, round or the like. In some embodiments test pads 230 are formed between groups of TSVs 280 over the TSV stripe 240. A number of test pads 230 may also be formed over the interface 260, for example, near an edge of the memory die stack 160 or other suitable position.

The TSVs 280 provide interconnections between the master die 122 and the slave dies 124. The TSVs 280 are formed in groups, in the TSV stripes 240, where they are conveniently positioned near circuitries included in the TSV stripe 240, including drivers/receivers for TSV signals. Through the interconnections provided by the TSVs 280, signals and data including array block control signals and data can travel from one of the slave dies 124 to the master die 122. In the master die 122, they can further travel to the circuitries in interface 260, which are coupled to respective TSVs 280. These signals and data can travel, via interconnections not shown in FIG. 2, to respective connection pads 270. More structural details of portions of the memory die stack 160 are given below with respect to FIGS. 3, 4, and 6.

Figure 3:
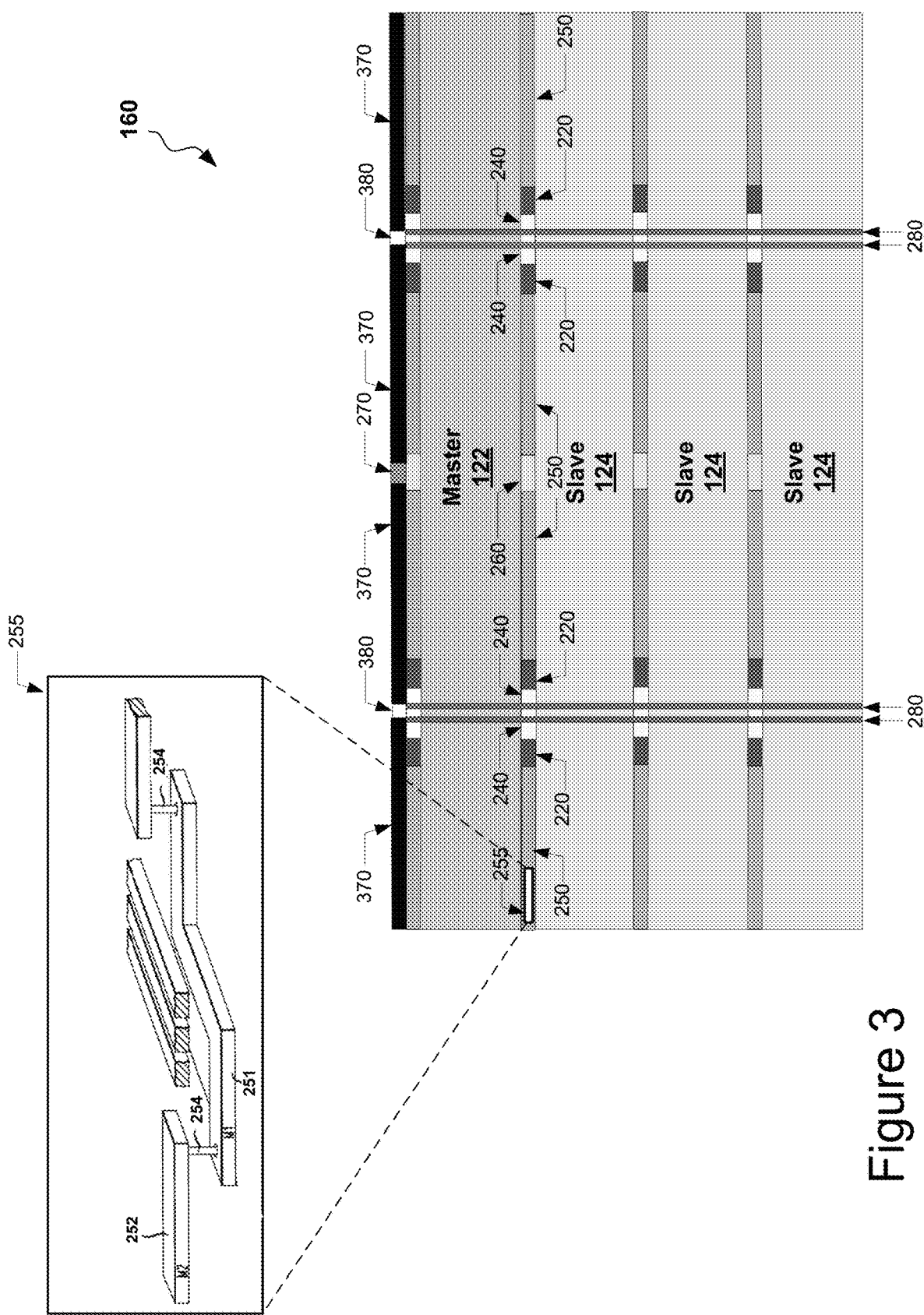
FIG. 3 illustrates a cross sectional view of the memory die stack of FIG. 2, as viewed along line A-A' of FIG. 2, according to an embodiment.

FIG. 3 illustrates a cross sectional view of the memory die stack 160 of FIG. 1, as viewed along line A-A' in FIG. 2, according to an embodiment. For purpose of brevity, and considering that the slave dies 124 are structurally similar, reference numbers for components of slave dies 124, which are also common with the master die 122, are only shown on the top slave die 124. The structural components shown by reference numbers on the top of the master die 122 are unique to the master die 122. In each memory die, various structures are formed on a top portion of the die, with the remaining portion of the die comprising a die substrate, which is thinned to a suitable thickness for forming the stack

160. On each memory die the largest area is occupied by the array blocks 250, which contain the array cells and on-pitch circuitry.

Attached to each array block 250 is the column circuit 220, which contains support circuits for the array block 250 and is coupled to the on-pitch circuitry (not shown). In some embodiments, the column circuit 220 includes the column-line driver circuits, the column-address decoders, the column line redundancy circuits, and the secondary sense amplifiers. The TSVs 280 are shown to penetrate through the substrate of every memory die of the memory die stack 160. In the slave dies 124, the TSVs 280 are only coupled to some of the circuitries of the TSV stripes 240, e.g., driver/receivers for TSV signals and some of the circuits of the column circuit 220, e.g., column address decoders and secondary sense amplifiers through the first and second low-resistance metal layers 251 and 252 (hereinafter "first metal 251" and "second metal 252" shown in magnified blow-up of portion 255). However, the TSVs 280 are not coupled to the circuitries in the interface 260 of the slave dies 124. As explained below, the first and second metals 251 and 252 are also used in the support structures, such as the interface 260 and the TSV stripes 240. Typically the bottom slave die is not thinned to the same thickness as the master and other slave dies so that the remaining thick silicon layer provides mechanical stability to the stack 160. This thick layer is not relevant for the electrical function of the memory stack 160 and omitted in the figures. The TSVs 280 do not need to penetrate the bottom slave die fully.

As shown in magnified blow-up of portion 255, one embodiment of the first and second metals 251 and 252 form first and second distribution lines in the core and are made of low-resistance conductors, such as metals including aluminum (Al) and copper (Cu). Vias 254 couple the first metal layer 251 to the second metal layer 252. In the array block 250, the first metal 251 is used to form master word-lines and sense-amplifier-control signal lines, whereas the second metal 252 is used to form array data-lines, column-select lines, some of the power distribution lines dedicated to providing power sufficient for low-speed array testing, and interconnections between test pads 230 and the circuitries in the array block 250. The first and second metals 251 and 252 are also used in the support structures, for example, first metal 251 forms the medium-distance signals lines and power distribution lines. In the support structures, the second metal 252 forms, for example, some of the power distribution lines sufficient to provide power for low speed array testing and some long-distance signal lines. It is worth mentioning here that in most conventional memory devices all of the long distance power distribution lines and long distance signal lines are formed by the second metal.

In the master die 122, a third low-resistance metal layer 370 (hereinafter "third metal 370") made of low-resistance conductors such as metals, for example, Al or Cu is used to connect the circuitries in the interface 260 and the connection pads 270 to the TSVs 280. The third metal 370 also interconnects connection pads 270 and the circuitries in the support structures such as TSV stripes 240 and interface 260. In some embodiments, the third metal 370 forms power distribution lines used for normal array operation, and in high speed testing which is normally performed after the memory die stack 160 is packaged. In some embodiments, the third metal 370 may be replaced with a redistribution layer (RDL) which can be formed during packaging of the memory die stack 160. Also shown in FIG. 3 are the insulator portions 380 formed between the TSVs 280 to electrically isolate the TSVs 280 from one another.

Figure 4A:
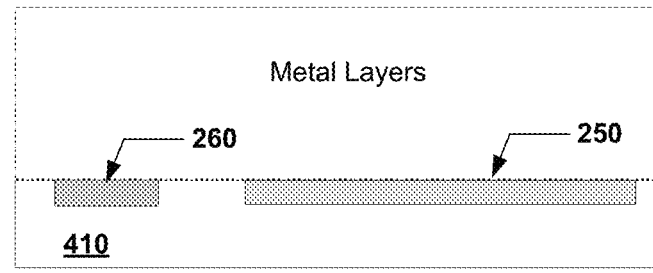
FIG. 4A illustrates a cross sectional view of an in-process memory die after formation of transistors in memory array blocks and interface circuit according to an embodiment.

FIG. 4A illustrates a cross sectional view of an in-process memory die 410 after formation of transistors in array blocks 250 and interface 260 according to an embodiment. A primary step in the process of manufacturing of each die in memory stack 160 of FIG. 3 is formation of transistors in the array block 250 and interface 260 shown in the in-process memory die 410. Interconnections between the array blocks 250, interface 260, and other circuits such as column circuits 220, row circuits 210, and TSVs of FIG. 2 are realized through metal layers shown in FIGS. 4B-4D. For simplicity, array blocks 250 and interface 260 are not shown in FIGS. 4B-4E.

Figure 4B:
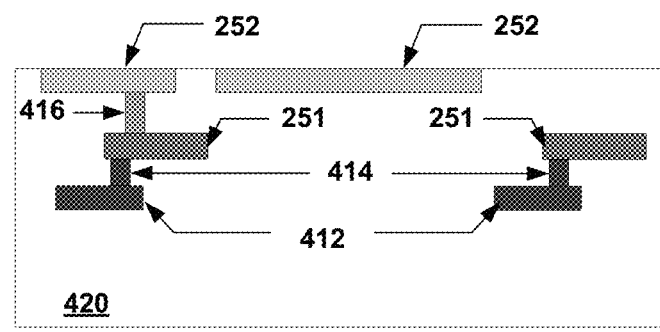
FIG. 4B illustrates a cross sectional view of an in-process memory die after formation of first and second metal layers according to an embodiment.

FIG. 4B illustrates a cross-sectional view of an in-process memory die 420 after formation of first and second metals 251 and 252 according to an embodiment. The memory die 420 is a starting die, which can be converted, upon further processing, to the slave die 124, the master die 122, or a stand-alone die 430 of FIG. 4D. The memory die 420 includes all of the components of the slave die 124, as discussed above with respect to FIGS. 2 and 3, except for the TSVs 280. However, for the sake of clarity, only metal layers and the corresponding vias in a portion of the memory die are shown. A high resistance metal layer 412 (also referred to as "metal0"), made of a high resistance metal such as tungsten (W), is used to form bit-lines and local short signal or power connections. The first metal 251 is coupled to the metal layer 412 by vias 414. The first metal 251 is connected by a via 416 to a portion of the second metal 252, which can be used as a test pad to test the circuitry coupled to the metal layer 412 and all or some of the circuitries coupled to the first metal 251 and the second metal 252 before or after fabrication of the TSV 280. Typically test circuitry will be implemented using, as connections, only metals 412, 251 and 252 to support the test of the array blocks 250 after wafer processing before assembly of the stack. Examples of the circuitries connected to the first metal 251 and the second metal 252 include master word-lines, sense amplifier control signal lines, array data-lines, column select lines, and signal and power distribution lines. The first and second metals 251 and 252 are typically routed perpendicular to each other. Typically, the second metal 252 is used to form longer distribution lines.

Figure 4C:
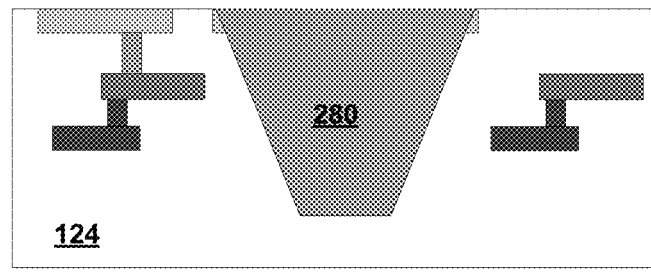
FIG. 4C illustrates a cross sectional view of the in-process memory die of FIG. 4B after further processing to form a slave die according to an embodiment.

FIG. 4C illustrates a cross sectional view of the in-process memory die 420 of FIG. 4B after further processing to form the slave die 124 according to an embodiment. An additional process of forming the TSV 280 converts the memory die 420 to the slave die 124. As seen in FIGS. 2 and 3, there are a number of TSVs 280 in each slave die and in FIG. 4C, for the sake of clarity, only one TSV 280 is shown. The TSV 280 is typically coupled to the second metal 252. The first metal 251, as explained above, is used to form distribution lines such as master word-lines, sense amplifier control signal lines and some medium distance power distribution and signal lines. These distribution lines are local to each slave die 124 and do not need to be coupled to the master die 122 via the TSVs. Also, the slave die 124 does not include the third metal 370 and is configured to receive its operating power from the master die 122 through the TSVs 280 after formation of the memory die stack (e.g., memory die stack 160 of FIG. 1). In particular, the slave die 124 lacks any coupling between the circuitries in the interface 260 of FIG. 3 and the first and second metals 251 and 252 and therefore from the interface 260 to the array blocks 250 of the slave die 124. However, the array blocks 250 of the slave die are coupled by first and second metals 251 and 252 to the TSV 280 and from there to the interface 260 of the master die 122. The slave die 124 can be used in the memory die stack 160 after a thinning process, which removes undesired substrate material under the bottom of the TSV 280. The slave die at the bottom of the stack may not be thinned and can provide mechanical stability to the stack.

Figure 4D:
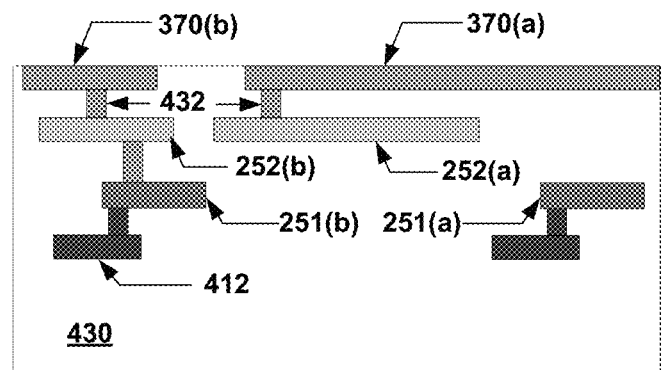
FIG. 4D illustrates a cross sectional view of the in-process memory die of FIG. 4B after further processing to form a stand-alone die according to an embodiment.

FIG. 4D illustrates a cross sectional view of the in-process memory die 420 of FIG. 4B after further processing to form a stand-alone memory die 430 according to an embodiment. The stand-alone memory die 430 is fabricated by forming vias 432 and the third metal 370 (shown as having portions 370(*a*) and 370(*b*)). The third metal 370(*a*) couples to the second metal 252 and from there to all of the circuitries that are coupled to the second metal 252 (shown as portions 252(*a*) and 252(*b*)). A portion of the third metal 370(*b*) forms the test pad for the stand-alone memory die 430 and can be used to test the circuitry coupled to the metal layer 412 and all or some of the circuitries coupled to the first metal 251(*a*) and the second metal 252(*b*) including master word-lines, sense amplifier control signal lines, array data-lines, column select lines, and signal and power distribution lines. The stand-alone memory die 420 can be packaged and sold as a stand-alone memory device. This feature is viewed as an advantage of the disclosed embodiments that allows fabrication of the stand-alone memory die 430, in addition to the master die 122 and the slave die 124, from the same starter die.

Figure 4E:
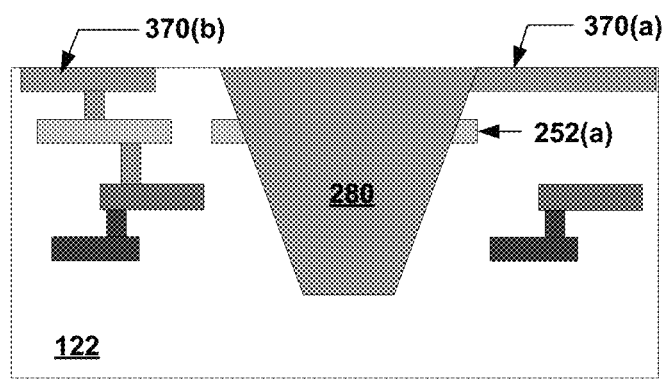
FIG. 4E illustrates a cross sectional view of the in-process memory die of FIG. 4D after further processing to form a master die according to an embodiment.

FIG. 4E illustrates a cross sectional view of the in-process memory die 430 of FIG. 4D after further processing to form the master die 122 according to an embodiment. The master die 122 is formed by fabricating the TSV 280 through the second metal 252(*a*) and the third metal 370(*a*). A portion of the third metal 370(*b*) forms the test pad 270 of FIGS. 2 and 3. A portion of the third metal 370(*a*) couples to a portion of the second metal 252(*a*), and can therefore communicate to all of the circuitries that are coupled to the second metal 252(*a*). In general, long distance interconnections and power distribution may be provided by the third metal 370. In particular, the third metal 370(*a*) couples the circuitries in the interface 260 of the master die 122 to the TSVs 280 and provides power distribution wiring for high-speed testing of the memory die stack 160.

Figure 4F:
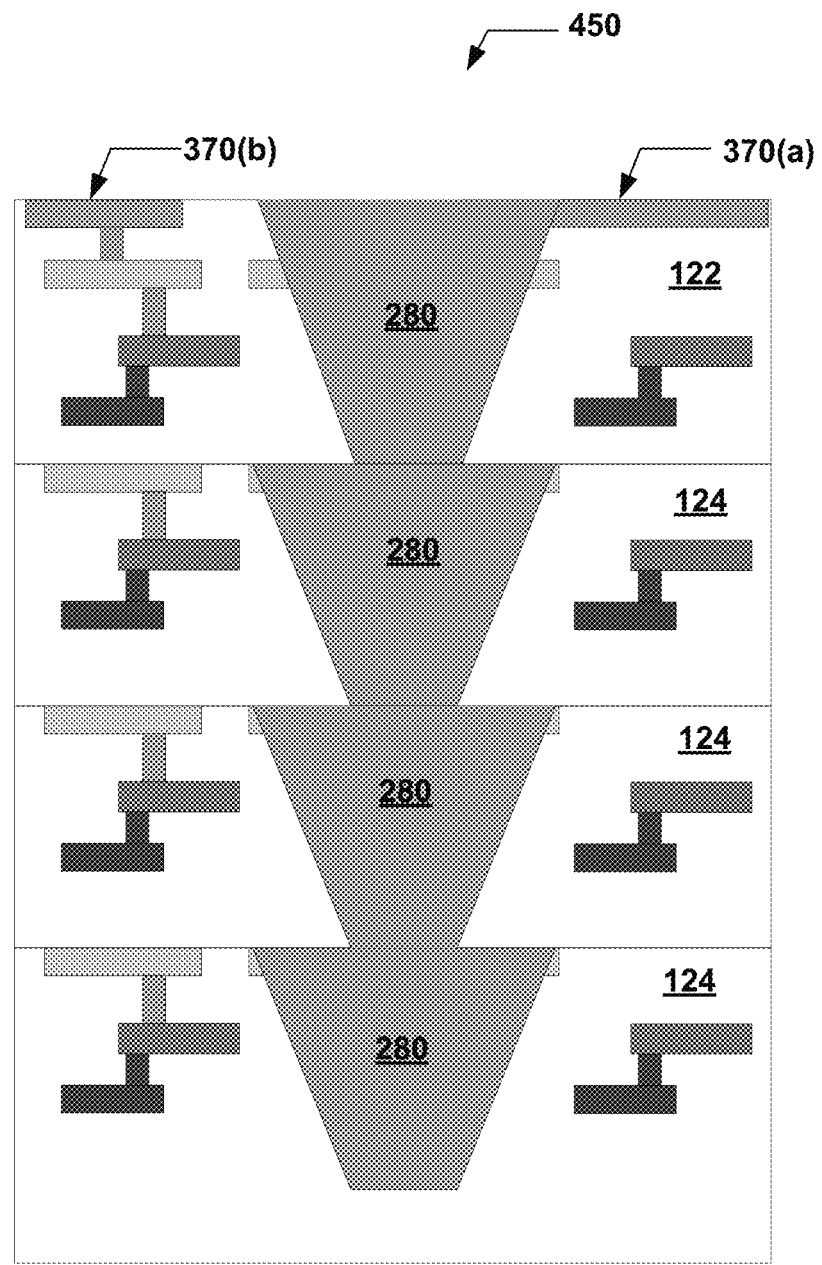
FIG. 4F illustrates a cross sectional view of an in-process memory die stack after stacking the master die of FIG. 4E and the slave die of FIG. 4C according to an embodiment.

FIG. 4F illustrates a cross sectional view of an in-process memory die stack 450 after stacking the master die 122 of FIG. 4E and the slave dies 124 of FIG. 4C according to an embodiment. Except for the bottom slave die 124, which is kept intact for structural support, the master die 122 and other slave dies 124 are thinned sufficiently for the bottom of the TSVs 280 to be exposed, so that they can interconnect to one another in the stack configuration. In the memory die stack 450, each slave die 124 has its interface 260 of FIG. 2 coupled to the TSV 280, and in the master die 122, the interface 260 is also coupled to the TSV 280. Therefore, signals can travel between each of the slave dies 124 and the connection pads 270 of FIG. 2, through the TSVs 280 and the interface 260 of the master die 122.

The memory die stack 450 shows a portion of the memory die stack 160 of FIG. 1, which when packaged forms the memory device 120 of FIG. 1. A portion of the third metal 370(*a*) is connected to the TSV 280 to couple the interface 260 of the master die 122 to core circuitries of the slave dies 124. Test pads 230 are accessible on the master die after assembly of the memory die stack 160 to provide additional testing options. A main advantage of the memory device 120 is revealed through careful examination of the formation steps of the memory dies of FIGS. 4B-4E and the memory die stack 450. Specifically, the cost savings due to the elimination of the third metal in the slave dies 124 can be quite considerable. In addition, the opportunity provided by the disclosed embodiments to fabricate the stand-alone memory die 430, the master die 122, and the slave dies 124, using the starting die 420 is also advantageous. Specifically, it allows significant cost savings using the same lithographic masks and fabrication processes in the mass production of the starting die 420, which then can be converted to any of the master die 122, the slave dies 124, or the stand-alone memory die 430.

Figure 5A:
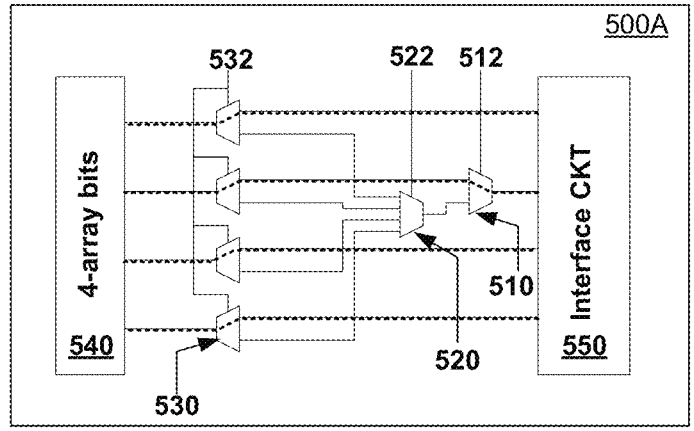
FIG. 5A illustrates a schematic diagram of a multiplexer circuit used in a ×16 stand-alone die according to an embodiment.

While the structures and methods described above lend themselves well to reducing costs associated with memory device metallization layers, further steps may be taken in some embodiments to reduce costs associated with TSV formation. FIG. 5A illustrates a schematic diagram of a multiplexer circuit 500A used in a ×16 stand-alone memory die 430 of FIG. 4D according to an embodiment. As discussed above with respect to FIG. 1, a DRAM device may be known as a ×4, ×8, or ×16 DRAM, depending on the number of data bits (e.g., 4 bits (×4), 8 bits (×8), or 16 bits (×16)) that it provides at its output. The stand-alone memory die 430 can be configured, for example, as a ×16 memory device by using a number of multiplexer circuits 500A. The multiplexer circuit 500A includes a multiplexer 510, a multiplexer 520, and four de-multiplexers 530. The multiplexers 510 and 520 are 2-input and 4-input multiplexers, respectively, whereas each de-multiplexer 530 is a 2-output de-multiplexer. One multiplexer circuit 500A is needed for four data lines connected to the array blocks 250 of FIG. 2. For example, in a DDR3 memory device, where 8 array data lines correspond to one external data line, a ×16 DRAM that has 128 array data lines in total needs 32 multiplexer circuits 500A. Address select signals 512 and 522 select routing from the inputs to one of the outputs of the multiplexers 510 and 520, respectively. Similarly, address select signal 532 selects routing from the input to one of the outputs of the de-multiplexer 530. In the configuration shown in FIG. 5A, the address select signals 512, 522, and 532 are asserted such that all 4 array bits 540 are coupled through the dotted-line routes to an interface circuit 550. The 4 array bits 540 are provided at the edge of the array block 250 of FIG. 2. The interface circuit 550 is formed in the interface 260 of FIG. 2. The multiplexers 510 and 520 are formed in one of the TSV stripes 240 and coupled to the interface circuit 550 through the third metal 370 of FIG. 3. In embodiments, the assertion of the address select signals 512, 522, and 532 can be configured during packaging of the memory die (e.g., memory die 430) by using fuses or by hard bonding of respective pads.

Figure 5B:
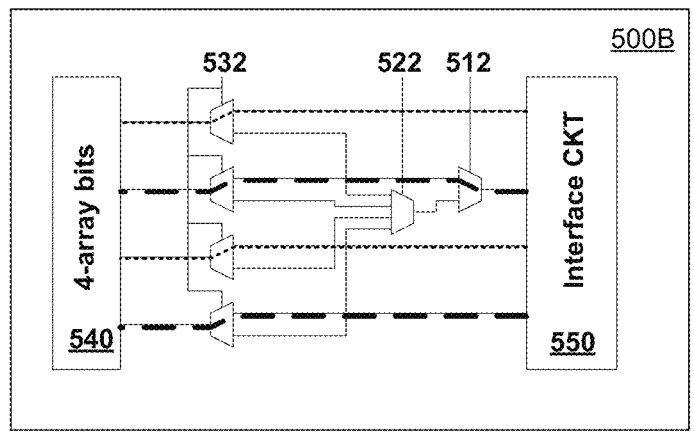
FIG. 5B illustrates a schematic diagram of a multiplexer circuit used in a ×8 stand-alone die according to an embodiment.

FIG. 5B illustrates a schematic diagram of a multiplexer circuit 500B used in a ×8 stand-alone memory die 430 of FIG. 4D according to an embodiment. The stand-alone memory die 430, in this embodiment, is configured as a ×8 memory device by asserting the address select signals 512, 522, and 532 such that either the routes marked by broken-lines or the routes marked by dotted-lines are selected to couple signals between the 4-array bits 540 and the interface circuit 550, therefore providing paths for two routes since in a ×8 memory only half of the bits are needed simultaneously. In embodiments, the assertion of the address select signals 512, 522, and 532 can be configured during packaging of the memory die (e.g., memory die 430) by using fuses or by hard bonding of respective pads.

Figure 5C:
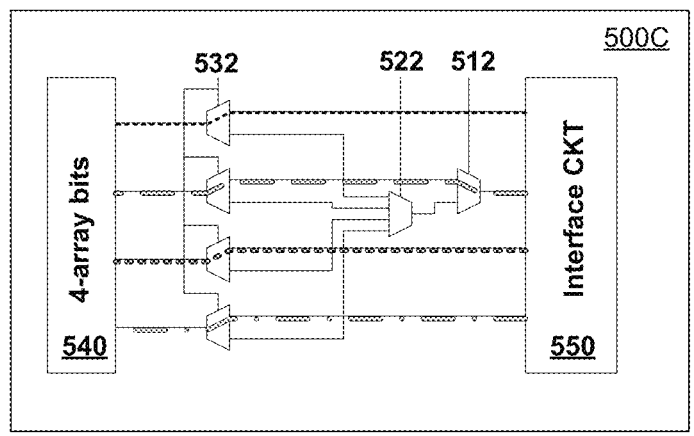
FIG. 5C illustrates a schematic diagram of a multiplexer circuit used in a ×4 stand-alone die according to an embodiment.

FIG. 5C illustrates a schematic diagram of a multiplexer circuit 500C used in a ×4 stand-alone memory die 430 of FIG. 4D according to an embodiment. The stand-alone memory die 430, in this embodiment, is configured as a ×4 memory device by asserting the address select signals 512, 522, and 532 such that only one of the four differently-marked routes are selected to couple signals between the 4 array bits 540 and the interface circuit 550, therefore providing a path for only one route. The ×4 memories may be more suitable for error correction schemes, and their use may be more common in server DRAM applications. In embodiments, the assertion of the address select signals 512, 522, and 532 can be configured during packaging of the memory die (e.g., memory die 430) by using fuses or by hard bonding of respective pads.

Figure 5D:
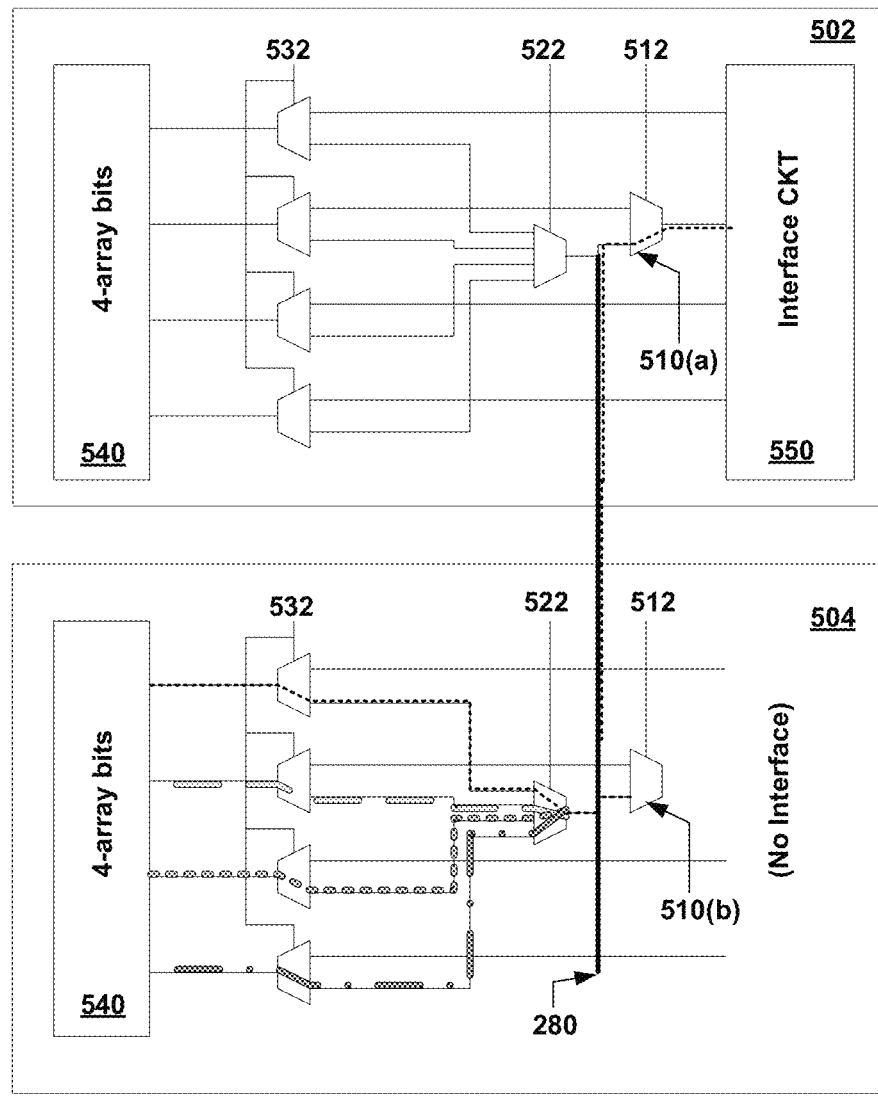
FIG. 5D illustrates a schematic diagram of a multiplexer circuit used in the memory die stack of FIG. 1 according to an embodiment.

FIG. 5D illustrates a schematic diagram of multiplexer circuits 502 and 504 used in the memory die stack 160 of FIG. 1 according to an embodiment. In the memory die stack 160, at any moment of time only one of the memory dies (e.g., the master die 122 or the slave dies 124) may be selected to communicate data to the interface circuit 550 of the multiplexer circuits 502. The selection of the communicating die is performed by suitable configuration of the multiplexer circuits 502 and 504. The multiplexer circuit 502 is formed on the master die 122, whereas the multiplexer circuit 504 is formed on each of the slave dies 124. The multiplexer circuit 502 and the multiplexer circuit 504 are coupled via the TSVs 280. Note that in the slave die 124, the interface circuit 550 is not accessible because it is not coupled to the second and third metals 252 and 370, as discussed above with respect to FIG. 3.

As described below, the multiplexers of FIG. 5D allow providing one bit of output data from the four-die memory die stack 160 of FIG. 1, by using only one TSV for every 4 array bits. Alternatively, should the memory dies of the memory die stack 160 be configured to couple to the memory controller 140 of FIG. 1 independently, via separate sets of TSVs, four TSVs per four array bits would be needed. Therefore, the use of the multiplexers of FIG. 5D reduces the number of TSVs and thus adds to the cost savings described above with respect to metallization layers.

For selection of the master die 122 for communicating with the interface 550, the multiplexer circuit 502 is configured similar to the multiplexer circuit 500C of FIG. 5C, and none of the address select signals 512, 522, or 532 of the multiplexer circuit 504 are asserted. For selection of one of the slave dies 124 for communicating with the interface circuit 550, the address select signals 512, 522, or 532 of multiplexer circuit 504 are asserted such that only one of the differently-marked routes are selected to carry one bit of data from the 4 array bits 540 to the TSVs 280. In addition, the address select signal 512 of the multiplexer 510(*a*) is asserted to allow the bit of data to travel from the TSVs 280 to the interface circuit 550. In embodiments, the assertion of the address select signals 512, 522, and 532 can be configured during packaging of the memory die stack 160 by using fuses or by hard bonding of respective pads.

Figure 6A:
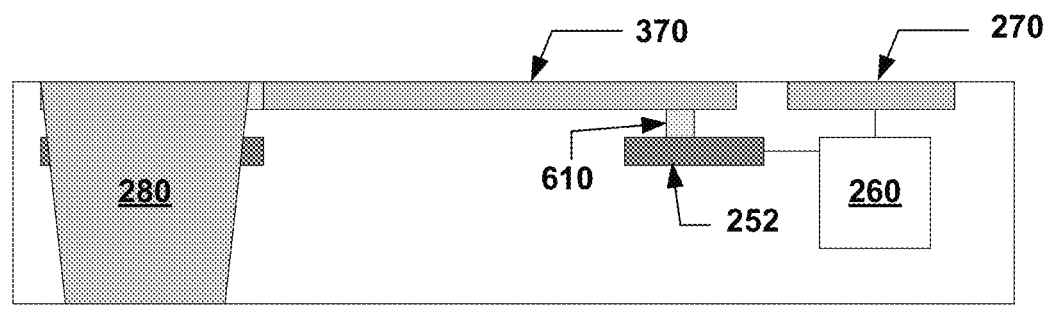
FIG. 6A illustrates a cross sectional view of a portion of a master memory die with a connection to a through-silicon-via (TSV) utilizing one or more third metal layers according to an embodiment.

FIG. 6A illustrates a cross sectional view of a portion of the master die 122 with a connection to the TSV 280 through the third metal 370 according to an embodiment. In this embodiment, similar to the master die 122 of FIG. 3, the connection to the TSV 280 of the circuitry in the interface 260 is provided by the third metal 370. The interface 260 is coupled to the second metal 252, which is in turn connected through a via 610 to the third metal 370. Depending on the position of the TSV 280 with respect to the interface 260, a signal from the interface 260 to the TSV 280 may have to travel a substantially long distance. In FIG. 6A, the pad 270 shown to be coupled to the interface 260 comprises one of the pads 270 of FIG. 2, which are positioned over the interface 260 region (see FIG. 2).

Figure 6B:
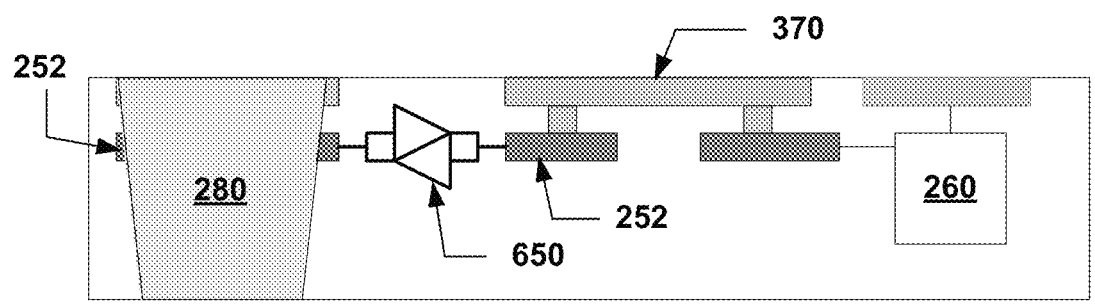
FIG. 6B illustrates a cross sectional view of a portion of a master memory die with a connection to a TSV through a re-driver circuit according to an embodiment.

FIG. 6B illustrates a cross sectional view of a portion of the master die 122 similar to the embodiment shown in FIG. 6A, but with a connection to the TSV 280 through a re-driver circuit 650 according to an embodiment. In this embodiment, unlike the embodiment of FIG. 6A, in which the interface 260 is coupled to the TSV 280 via the third metal 370, the coupling of the interface 260 to the TSV 280 is provided via the second metal 252 and through a re-driver circuit 650 and only partially through the third metal 370. The advantage of this embodiment over the embodiment of FIG. 6A lies in the operational speed of the coupling. Specifically, the embodiment of FIG. 6B provides a faster coupling than that of FIG. 6A. The higher speed of the embodiment in FIG. 6B is due to reduction of the loading of the TSV by eliminating the substantially long route in the third metal 370 that a signal has to travel. In this embodiment, signals travel between the interface 260 and the TSV 280 through the re-driver circuit 650, which can provide buffering and power amplification for the traveling signal, therefore improving the speed of the coupling.

Figure 7:
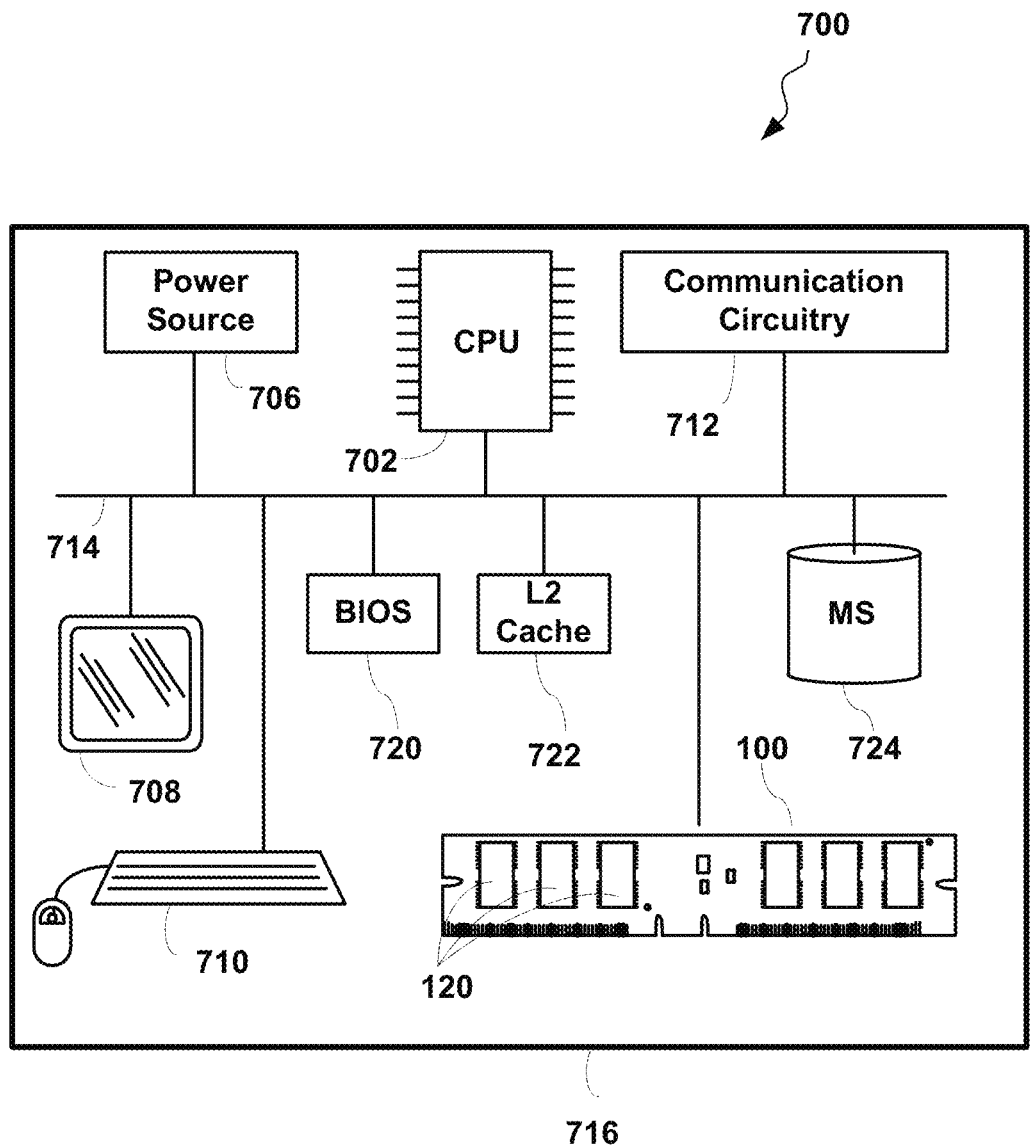
FIG. 7 illustrates a block diagram of a computer system using the DIMM of FIG. 1 according to an embodiment.

FIG. 7 illustrates a block diagram of a computer system 700 using the DIMM 100 of FIG. 1 according to an embodiment. The system 700 includes a plurality of components, such as at least one central processing unit (CPU) 702; a power source 706, such as a power transformer, power supply, or batteries; input and/or output devices, such as a keyboard and mouse 710 and a monitor 708; communication circuitry 712; a BIOS 720; a level two (L2) cache 722; Mass Storage (MS) 724, such as a hard-drive; Dynamic Random Access Memory (DRAM) 120; and at least one bus 714 that connects the aforementioned components. These components are at least partially housed within a housing 716. Some components may be consolidated together, such as the L2 cache 722 and the CPU 702. The DRAM 120 includes one or more stacked memory dies 160 described above.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS)

technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. A memory device comprising:
    a first integrated circuit (IC) memory die including
        first memory core circuitry,
        first interface circuitry,
    a second IC memory die stacked with the first IC memory die, the second IC memory die including
        second memory core circuitry,
        second interface circuitry coupled to the second memory core circuitry and the first memory core circuitry, the second interface circuitry formed to match the first interface circuitry, the first interface circuitry formed to match the second interface circuity; and
    wherein the second interface circuitry of the second die is configured to transfer signals between the first memory core circuitry and a memory controller.

2. The memory device according to claim 1, wherein:
    the first IC memory die is formed with a first number of metal layers; and
    the second IC memory die is formed with a second number of metal layers that is higher than the first number of metal layers.

3. The memory device according to claim 2, wherein:
    the second interface circuitry electrically couples to the second memory core circuitry via a first conductive path having a first portion that is formed in one of the second number of metal layers; and
    the first memory core circuitry is electrically decoupled from the first interface circuitry.

4. The memory device according to claim 3, wherein the one of the second number of metal layers comprises:
    a redistribution layer formed during a packaging process.

5. The memory device according to claim 4, wherein the first conductive path includes a second portion that is formed in at least one through-silicon-via (TSV).

6. The memory device according to claim 5, wherein:
    the first conductive path electrically connects the second memory core circuitry to the second interface circuitry via the one of the second number of metal layers and the at least one TSV.

7. The memory device according to claim 1, wherein:
    the first and second IC memory die comprise dynamic random access memory (DRAM) IC die.

8. A memory module, comprising:
    a substrate;
    multiple memory devices mounted to the substrate, each memory device comprising
        a first integrated circuit (IC) memory die including
            first memory core circuitry,
            first interface circuitry,
        a second IC memory die stacked with the first IC memory die, the second IC memory die including
            second memory core circuitry,
            second interface circuitry coupled to the second memory core circuitry and the first memory core circuitry, the second interface circuitry formed to match the first interface circuitry, the first interface circuitry formed to match the second interface circuitry; and
        wherein the second interface circuitry of the second die is configured to transfer signals between the first memory core circuitry and a memory controller.

9. The memory module according to claim 8, wherein:
    the first IC memory die is formed with a first number of metal layers; and
    the second IC memory die is formed with a second number of metal layers that is higher than the first number of metal layers.

10. The memory module according to claim 9, wherein:
    the second interface circuitry electrically couples to the second memory core circuitry via a first conductive path having a first portion that is formed in one of the second number of metal layers; and
    the first memory core circuitry is electrically decoupled from the first interface circuitry.

11. The memory module according to claim 10, wherein the one of the second number of metal layers comprises:
    a redistribution layer formed during a packaging process.

12. The memory module according to claim 11, wherein the first conductive path includes a second portion that is formed in at least one through-silicon-via (TSV).

13. The memory module according to claim 12, wherein:
the first conductive path electrically connects the second memory core circuitry to the second interface circuitry via the one of the second number of metal layers and the at least one TSV.

14. The memory module according to claim 8, wherein:
the first and second IC memory die comprise dynamic random access memory (DRAM) IC die.

15. A memory, comprising:
at least one memory module including
  a substrate;
  multiple memory devices mounted to the substrate, each memory device comprising
    a first integrated circuit (IC) memory die including
      first memory core circuitry,
      first interface circuitry,
    a second IC memory die stacked with the first IC memory die, the second IC memory die including
      second memory core circuitry,
      second interface circuitry coupled to the second memory core circuitry and the first memory core circuitry, the second interface circuitry formed to match the first interface circuitry, the first interface circuitry formed to match the second interface circuitry; and
    wherein the second interface circuitry of the second die is configured to transfer signals between the first memory core circuitry and a memory controller.

16. The memory according to claim 15, wherein for each of the memory devices:
  the first IC memory die is formed with a first number of metal layers; and
  the second IC memory die is formed with a second number of metal layers that is higher than the first number of metal layers.

17. The memory according to claim 16, wherein:
  the second interface circuitry electrically couples to the second memory core circuitry via a first conductive path having a first portion that is formed in one of the second number of metal layers; and
  the first memory core circuitry is electrically decoupled from the first interface circuitry.

18. The memory according to claim 17, wherein the one of the second number of metal layers comprises:
  a redistribution layer formed during a packaging process.

19. The memory according to claim 17, wherein the first conductive path includes a second portion that is formed in at least one through-silicon-via (TSV).

20. The memory according to claim 19, wherein:
  the first conductive path electrically connects the second memory core circuitry to the second interface circuitry via the one of the second number of metal layers and the at least one TSV.

* * * * *